(12) United States Patent
Yamazaki et al.

(10) Patent No.: US 7,180,091 B2
(45) Date of Patent: Feb. 20, 2007

(54) SEMICONDUCTOR DEVICE AND MANUFACTURING METHOD THEREOF

(75) Inventors: Shunpei Yamazaki, Tokyo (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 108 days.

(21) Appl. No.: 10/208,246

(22) Filed: Jul. 31, 2002

(65) Prior Publication Data

US 2003/0047732 A1  Mar. 13, 2003

(30) Foreign Application Priority Data

Aug. 1, 2001  (JP) ........................... 2001-234293

(51) Int. Cl.
*H01L 29/04* (2006.01)
*H01L 31/036* (2006.01)
*H01L 31/0376* (2006.01)
*H01L 31/20* (2006.01)

(52) U.S. Cl. ..................... 257/59; 257/72; 257/258; 257/291

(58) Field of Classification Search ............ 257/59, 257/72, 258, 291
See application file for complete search history.

(56) References Cited

U.S. PATENT DOCUMENTS

| 5,206,749 | A | 4/1993 | Zavracky et al. |
| 5,273,475 | A | 12/1993 | Oshikawa |
| 5,317,236 | A | 5/1994 | Zavracky et al. |
| 5,376,561 | A | 12/1994 | Vu et al. |
| 5,654,811 | A | 8/1997 | Spitzer et al. |
| 5,781,164 | A | 7/1998 | Jacobsen et al. |
| 5,807,440 | A | 9/1998 | Kubota et al. |
| 5,817,548 | A | 10/1998 | Noguchi et al. |
| 5,821,138 | A | 10/1998 | Yamazaki et al. |
| 5,879,741 | A | 3/1999 | Itoh |

(Continued)

FOREIGN PATENT DOCUMENTS

| JP | 05-347186 | 12/1993 |
| JP | 6-214220 | 8/1994 |
| JP | 2001-085154 | 3/2001 |
| JP | 2001-189460 | 7/2001 |
| JP | 2001-267578 | 9/2001 |
| JP | 3238223 | 12/2001 |
| JP | 2002-328624 | 11/2002 |
| WO | WO 92/12453 | 7/1992 |
| WO | WO 2000/046854 | 8/2000 |

OTHER PUBLICATIONS

Webster's New World Dictionary of American English, Third College Edition, Victoria Neufeldt et al., Jan. 1, 1998, p. 1479.

*Primary Examiner*—Thien F Tran
(74) *Attorney, Agent, or Firm*—Nixon Peabody LLP; Jeffrey L. Costellia (57) ABSTRACT

The invention relates to a semiconductor device including a plurality of thin film transistors provided on a base member having a curved surface. The surface may be bent in either a convex shape or a concave shape. All channel length directions of the plurality of thin film transistors may also be aligned in the same direction. Further, the channel length direction may be different from the direction in which the base member is bent. A pixel portion and a driver circuit portion may also be provided on the base member. The invention also includes a method of manufacturing a semiconductor device including forming a layer to be peeled including an element of a substrate, bonding a support member to the layer to be peeled, and bonding a transfer body to the layer to be peeled.

21 Claims, 8 Drawing Sheets

U.S. PATENT DOCUMENTS

| | | |
|---|---|---|
| 5,929,961 A | 7/1999 | Nishi et al. |
| 5,943,593 A | 8/1999 | Noguchi et al. |
| 6,020,271 A | 2/2000 | Yanagida |
| 6,043,800 A | 3/2000 | Spitzer et al. |
| 6,096,581 A | 8/2000 | Zhang et al. |
| 6,140,980 A | 10/2000 | Spitzer et al. |
| 6,190,937 B1 | 2/2001 | Nakagawa et al. |
| 6,261,634 B1 | 7/2001 | Itoh |
| 6,320,640 B2 | 11/2001 | Nishi et al. |
| 6,372,608 B1 | 4/2002 | Shimoda et al. |
| 6,376,333 B1 | 4/2002 | Yamazaki et al. |
| 6,423,614 B1 | 7/2002 | Doyle |
| 6,506,664 B1 | 1/2003 | Beyne et al. |
| 6,582,996 B1 | 6/2003 | Hara et al. |
| 6,627,518 B1 | 9/2003 | Inoue et al. |
| 6,664,730 B2 | 12/2003 | Weaver |
| 2001/0022362 A1 | 9/2001 | Hayashi et al. |
| 2002/0004292 A1 | 1/2002 | Yamazaki et al. |
| 2002/0048864 A1 | 4/2002 | Yamazaki et al. |
| 2003/0025146 A1 | 2/2003 | Narwankar et al. |
| 2003/0059990 A1 | 3/2003 | Yamazaki |
| 2003/0062845 A1 | 4/2003 | Yamazaki et al. |
| 2003/0075733 A1 | 4/2003 | Yamazaki et al. |
| 2003/0100169 A1 | 5/2003 | Tanaka et al. |
| 2003/0162312 A1 | 8/2003 | Takayama et al. |
| 2004/0106237 A1 | 6/2004 | Yamazaki |

LASER LIGHT

SEMICONDUCTOR DEVICE AND MANUFACTURING METHOD THEREOF

BACKGROUND OF THE INVENTION

1. Field of the Invention

The present invention relates to a semiconductor device having a circuit composed of thin film transistors (hereinafter referred to as TFTs) transferred by bonding a peeled layer (to be peeled) to a base member and a manufacturing method thereof. More particularly, the present invention relates to an electro-optical device which is represented by a liquid crystal module, a light emitting device which is represented by an EL module, and electronic equipment on which such a device is mounted as a part.

Note that a semiconductor device in this specification indicates general devices functioning by utilizing semiconductor characteristics, and an electro-optical device, a light emitting device, a semiconductor circuit, and electronic equipment are all semiconductor devices.

2. Description of the Related Art

In recent years, a technique of constructing a thin film transistor (TFT) using a semiconductor thin film (about several to several hundred nm in thickness) formed on a substrate having an insulating surface has been noted. The thin film transistor is widely applied to an electronic device such as an IC or an electro-optical device. In particular, the development of the thin film transistor as a switching element of an image display device is urgently necessary.

Various applications utilizing such an image display device are expected, and particularly its utilization in a portable device is noted. Currently, a glass substrate or a quartz substrate is used for forming the TFT in many cases. However, there is a defect that the above substrate is easy to crack and heavy. In addition, in the case of mass production, it is difficult and thus not suitable to use a large size glass substrate and a large size quartz substrate. Thus, it is attempted to form a TFT element on a flexible substrate, typically, a flexible plastic film.

However, the plastic film has a low heat resistance, so that it is necessary to reduce a maximum temperature of a process. As a result, under the current circumstances, a TFT having a preferable electrical characteristic cannot be formed on the plastic film as compared with the case where the glass substrate is used. Therefore, a liquid crystal display device and a light emitting element for which the plastic film is used and which each have a high performance are not realized.

SUMMARY OF THE INVENTION

If a light emitting device in which an organic light emitting element (OLED: organic light emitting device) is formed or a liquid crystal display device can be manufactured on a flexible substrate such as a plastic film, such a device can be used for a display having a curved surface, a show window and the like in addition to being thin and light weight. Thus, its use is not limited to only a mobile device and the scope of application is very wide.

An object of the present invention is to provide a semiconductor device in which a layer to be peeled is bonded to a base member having a curved surface and a manufacturing method thereof. More particularly, an object of the present invention is to provide a display having a curved surface, specifically, a light emitting device having an OLED in which the layer to be peeled is bonded to the base member having the curved surface, or a liquid crystal display device in which the layer to be peeled is bonded to the base member having the curved surface.

Also, another object of the present invention is to provide a semiconductor device in which various elements (a thin film diode, a photoelectric conversion element which is made of silicon and has a PIN junction, and a silicon resistor element) represented by a TFT are bonded to a flexible film (bendable film) and a manufacturing method thereof.

According to the present invention, when a layer to be peeled including elements is formed on a substrate, all channel length directions of regions which serve as channels of the elements are aligned with the same direction and laser light irradiation is conducted for scanning in the same direction as the channel length direction to complete the elements. After that, the layer to be peeled is bonded to a base member having a curved surface which is bent in a direction different from the channel length direction, that is, in a channel width direction to realize a display having a curved surface. Note that, when the layer to be peeled is bonded to the base member having the curved surface, it is bent along the curved surface of the base member. According to the present invention, all channel length directions of the elements are aligned with the same direction and the channel length directions are different from a direction in which the base member is bent. Thus, even if the layer to be peeled including the elements is bent, the influence on element characteristics can be minimized. In other words, a semiconductor device which is resistant to deformation in a predetermined direction (here, the direction in which the base member is bent) can be provided.

According to the present invention with respect to a manufacturing method disclosed in this specification, the manufacturing method of a semiconductor device comprises:

forming a layer to be peeled including an element on a substrate;

bonding a support member to the layer to be peeled including the element and then peeling the support member from the substrate by physical means; and bonding a transfer body to the layer to be peeled including the element to sandwich the element between the support member and the transfer body, in which the element is a thin film transistor using as a channel a semiconductor layer overlapped with a gate electrode through an insulating film interposed therebetween, and a step of forming the semiconductor layer includes processing for performing laser light irradiation for scanning in the same direction as a channel length direction of the channel.

However, in the above constitution, when the layer to be peeled has a sufficient mechanical strength, the transfer body for fixing the layer to be peeled may not be bonded thereto.

Note that, in the above constitution, a plurality of thin film transistors are provided and all channel length directions of the plurality of thin film transistors are aligned with the same direction.

Also, in the above constitution, the support member has a curved surface which is bent in a convex shape or a concave shape, and a direction in which the support member is bent is different from the channel length directions. In addition, when the transfer body is bonded, it has a curved surface which is bent in a convex shape or a concave shape along the curved surface of the support member. Thus, in the above constitution, the transfer body has a curved surface which is bent in a convex shape or a concave shape, and a direction in which the transfer body is bent is different from the channel length directions.

Also, in the above constitution, when a liquid crystal display device is produced, the support member is a counter substrate, the element has a pixel electrode, and a liquid crystal material is filled into a space between the pixel electrode and the counter substrate.

Also, in the above constitution, when a light emitting element having an OLED is produced, the support member is a sealing member and the element is a light emitting element.

Also, in the above constitution, a peeling method is not particularly limited. for example, a method of providing a separate layer between the layer to be peeled and the substrate and removing the separate layer by an agent solution (etchant) to separate the layer to be peeled and the substrate can be used. Alternatively, a method of providing a separate layer made of amorphous silicon (or polysilicon) between the layer to be peeled and the substrate and irradiating laser light thereto through the substrate to release hydrogen contained in the amorphous silicon, thereby producing gaps to separate the layer to be peeled and the substrate can be used. Note that, when the peeling is conducted using laser light, it is desirable that a beat treatment temperature is set to be 410° C. or lower so as not to release hydrogen before the peeling and the element included in the layer to be peeled is produced.

Also, as another peeling method, a peeling method of conducting peeling by utilizing film stresses of two layers may be used. According to this peeling method, a metallic layer, preferably, a metallic nitride layer is provided on a substrate, an oxide layer is provided in contact with the metallic nitride layer, and an element is produced on the oxide layer. Thus, even when film formation processing or heat treatment at 500° C. or higher is performed, film peeling is not caused. As a result, clean separation can be easily produced in an inner portion of the oxide layer or interface thereof by a physical means. In order to further promote peeling, heat treatment or laser light irradiation processing may be performed before the peeling is conducted by the physical means.

A semiconductor device obtained by the manufacturing method of the present invention as described above has various features.

According to a semiconductor device of the present invention disclosed in this specification, a plurality of thin film transistors are provided on a base member having a curved surface which is bent in a convex shape or a concave shape, all channel length directions of the plurality of thin film transistors are aligned with the same direction, and the channel length directions are different from a direction in which the base member is bent.

Also, the present invention can be applied to the case where a thin film transistor formed in a pixel portion is different from that formed in a driver circuit. According to a semiconductor device as another constitution of the present invention, a pixel portion and a driver circuit portion are provided on a base member having a curved surface which is bent in a convex shape or a concave shape, a channel length direction of a thin film transistor provided to the pixel portion and that of a thin film transistor provided to the driver circuit portion are aligned with the same direction, the channel length directions are different from a direction in which the base member is bent. Note that a design rule of a pattern is about 5 μm to 20 μm and about $10^6$ to $10^7$ TFTs are formed for each of the driver circuit and the pixel portion on a substrate.

Also, in the above respective constitutions, the channel length directions are the same direction as a scanning direction of laser light irradiated to a semiconductor layer composing the thin film transistors. In the case where a channel of the thin film transistor which is made from a semiconductor film crystallized by laser annealing is formed on a substrate, when a crystal growth direction is aligned with a carrier moving direction, high field effect mobility can be obtained. In other words, when the crystal growth direction is aligned with the channel length direction, the field effect mobility can be substantially increased. When a continuous oscillating laser beam is irradiated to a non-single crystalline semiconductor film for crystallization, a solid-liquid interface is kept. Thus, a continuous crystal growth can be produced in the scanning direction of the laser beam. For the laser light, a gas laser such as an excimer laser, a solid laser such as a YAG laser, or a semiconductor laser is preferably used. In addition, a laser oscillation mode may be either continuous oscillation or pulse oscillation. A laser beam may have a linear shape or a rectangular shape.

Also, in the above respective constitutions, the direction in which the base member is bent is orthogonal to the channel length direction. In other words, a is direction orthogonal to the channel length direction is a channel width direction. According to a semiconductor device of another constitution of the present invention, a plurality of thin film transistors are provided on a base member having a curved surface which is bent in a convex shape or a concave shape, all channel width directions of the plurality of thin film transistors are aligned with the same direction, and the channel width directions are the same direction as a direction in which the base member is bent.

Note that, in the above constitution, the channel width directions are orthogonal to a scanning direction of laser light irradiated to a semiconductor layer composing the thin film transistors.

Also, the base member having the curved surface is bent in the convex shape or the concave shape. If the base member is bent in a direction, it can be said that the base member includes a curved surface having a direction with a curvature and a direction with no curvature. Thus, according to a semiconductor device of another constitution of the present invention, all channel length directions of a plurality of thin film transistors provided on a surface of a base member including a curved surface having a direction with a curvature and a direction with no curvature are aligned with the same direction and the channel length directions are the same direction as the direction with no curvature.

Note that, in the above constitution, the channel length directions are the same direction as a scanning direction of laser light irradiated to a semiconductor layer composing the thin film transistors.

Also, the present invention can be applied to the case where a layer to be peeled is bonded to a flexible film (bendable film), preferably, a film bent in a direction. Note that the flexible film is not bent in a general state, and is bent in a direction by any external force. According to a semiconductor device of another constitution of the present invention, a plurality of thin film transistors are provided on a base member which can be bent in a convex shape or a concave shape, all channel length directions of the plurality of thin film transistors are aligned with the same direction, and a direction in which the base member is bent is different from the channel length directions.

Note that, in the above constitution, the channel length directions are the same direction as a scanning direction of laser light irradiated to a semiconductor layer composing the thin film transistors. In addition, in the above constitution, the direction in which the base member is bent is orthogonal to the channel length directions, that is, the direction in which the base member is bent is the same direction as a channel width direction.

Note that the transfer body in this specification is bonded to the layer to be peeled after peeling, particularly not limited if it has a curved surface, and may be a base member made of any composition such as plastic, glass, metal, or ceramics. In addition, the support member in this specification is bonded to the layer to be peeled in peeling by the physical means, particularly not limited, and may be a base member made of any composition such as plastic, glass, metal, or ceramics. In addition, the shape of the transfer body and the shape of the support member are not particularly limited. They may have a flat surface or a curved surface, may be flexible, or may be formed in a film shape. In addition, when weight reduction is the highest priority, a film-shaped plastic substrate, for example, a plastic substrate made of polyethylene terephthalate (PET), polyether sulfone (PES), polyethylene naphthalate (PEN), polycarbonate (PC), nylon, polyether etherketone (PEEK), polysulfone (PSF), polyether imide (PEI), polyallylate (PAR), polybutylene terephthalate (PBT), or the like is preferable.

DETAILED DESCRIPTION OF THE PREFERRED EMBODIMENTS

An embodiment mode of the present invention will be described below.

Hereinafter, a typical manufacturing order according to the present invention will be briefly described using FIGS. 1A to 1C and 2.

Figure 1A:
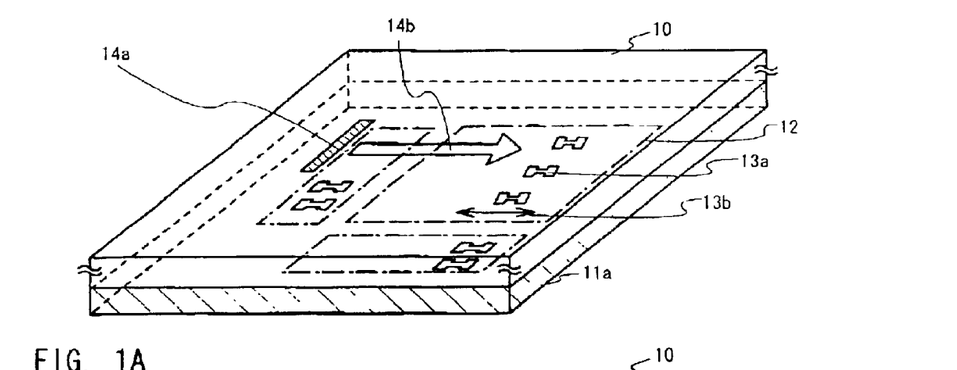
FIGS. 1A to 1C show manufacturing steps of the present invention (embodiment mode)

In FIG. 1A, reference numeral 10 denotes a substrate, 11a denotes a layer to be peeled, 12 denotes a pixel portion provided to the layer to be peeled, 13a denotes a semiconductor layer provided in the pixel portion, 13b denotes a channel length direction of the semiconductor layer 13a, 14a denotes a laser light irradiation area, and 14b denotes a laser light irradiation direction.

FIG. 1A shows a manufacturing step indicating the course of a completion of the layer to be peeled and is a schematic view indicating processing for irradiating laser light to the semiconductor layer. Laser crystallization and laser annealing can be conducted by the laser light irradiation processing. An oscillation mode may be either continuous oscillation or pulse oscillation. In order to continuously produce crystal growth with a molten state of the semiconductor film, it is desirable that a continuous oscillation mode is selected.

In FIG. 1A, all channel length directions of a large number of semiconductor layers included in the layer to be peeled are aligned with the same direction. In addition, assume that the laser light irradiation direction, that is, a scanning direction is the same direction as the channel length directions. Thus, when the crystal growth direction is aligned with the channel length direction, the field effect mobility can be substantially increased. Note that the example in which linear laser light irradiation is conducted is shown in FIG. 1A. However, the present invention is not particularly limited to this. In addition, here, the laser light irradiation is conducted after patterning the semiconductor layer. The laser light irradiation may be conducted before the patterning.

Next, various elements (such as a thin film diode, a photoelectric conversion element which is made of silicon and has a PIN junction, and a silicon resistor element) represented by a TFT are produced by forming electrodes, wirings, an insulating film, and the like to complete the layer to be peeled 11b, and then the layer to be peeled 11b is peeled from the substrate 10.

Note that the peeling method is not particularly limited. Here, a peeling method utilizing film stresses of a metallic layer or a nitride layer and an oxide layer is used as a peeling method which is not limited by a heat treatment temperature and a kind of substrate. First, before the state shown in FIG. 1A is obtained, a nitride layer or a metallic layer (not shown) is formed on the substrate 10. A typical example of the nitride layer or the metallic layer includes a single layer made of an element selected from the group consisting of Ti, W, Al, Ta, Mo, Cu, Cr, Nd, Fe, Ni, Co, Ru, Rh, Pd, Os, Ir, and Pt, or an alloy material or a compound material which contains mainly the element, or a laminate of those. In addition, a single layer made of nitride containing the element, for example, titanium nitride, tungsten nitride, tantalum nitride, or molybdenum nitride, or a laminate of those may be used. Next, an oxide layer (not shown) is formed on the nitride layer or the metallic layer. For a typical example of the oxide layer, a silicon oxide material, a silicon oxynitride material, or a metallic oxide material may be used. Note that the oxide layer may be formed by any film formation method such as a sputtering method, a plasma CVD method, or an applying method. It is important that film stress of the oxide layer is different from that of the nitride layer or the metallic layer. The respective film thicknesses are preferably set as appropriate in a range of 1 nm to 100 nm, thereby adjusting respective film stresses. In addition, an insulating layer or a metallic layer may be provided between the substrate and the nitride layer or the metallic layer to improve the contact property to the substrate 10. Next, a semiconductor layer is preferably formed on the oxide layer to obtain the layer to be peeled 11a. Note that, according to the above peeling method, even if the film stress of the oxide layer is different from that of the nitride layer or the metallic layer, film peeling or the like is not caused by heat treatment in a manufacturing step for the layer to be peeled. In addition, according to the above peeling method, the film stress of the oxide layer is different from that of the nitride layer or the metallic layer. Thus, peeling can be produced by relatively small force. In addition, the example in which the layer to be peeled 11b having a sufficient mechanical strength is assumed is indicated here. When the mechanical strength of the layer to be peeled 11b is insufficient, it is preferable that peeling is conducted after a support member (not shown) for fixing the layer to be peeled 11b is bonded thereto. Note that, when the layer to be peeled 11b is peeled, it is important to prevent a bend of the layer to be peeled 11b so that a crack is not caused in the layer to be peeled.

Figure 1B:
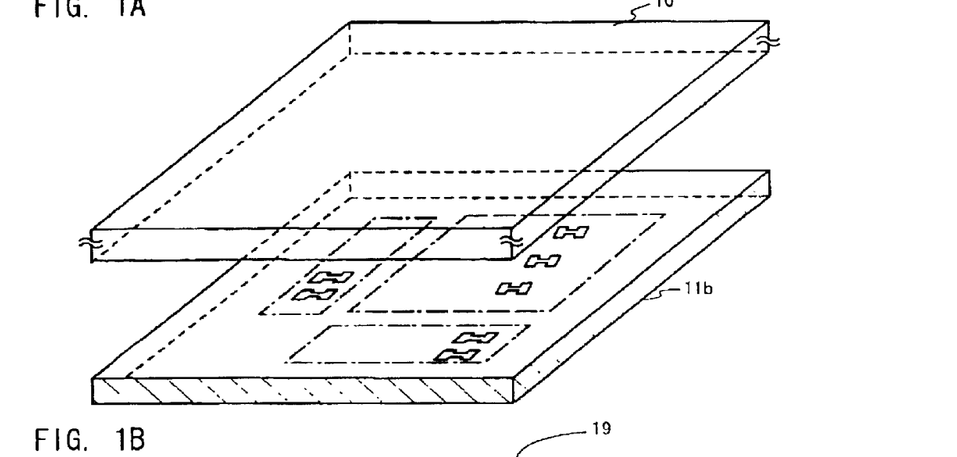

Thus, the layer to be peeled 11b which is formed on the oxide layer can be separated from the substrate 10. A state obtained after peeling is shown in FIG. 1B. In a stage shown in FIG. 1B, not only the semiconductor layer but also electrodes, wirings, and the like are formed. However, for simplification, they are not shown here.

Figure 1C:
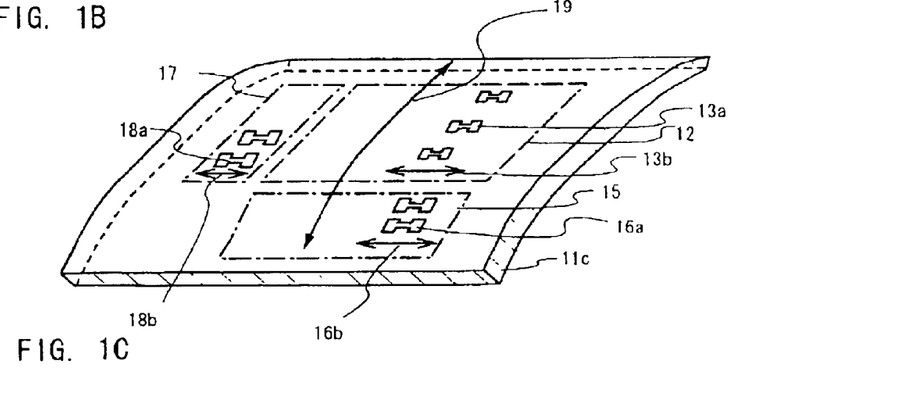

The peeled layer 11c can be bent. A state obtained after the bending is shown in FIG. 1C. The peeled layer 11c is bent in a bending direction 19. It is needless to say that the layer to be peeled can be bonded to a transfer body (not shown) having a curved surface.

In FIG. 1C, reference numeral 15 denotes a driver circuit (X-direction), 16a denotes a semiconductor layer provided in the driver circuit (X-direction), 16b denotes a channel length direction of the semiconductor layer 16a, 17 denotes a driver circuit (Y-direction), 18a denotes a semiconductor layer provided in the driver circuit (Y-direction), and 18b denotes a channel length direction of the semiconductor layer 18a.

Thus, the maximum feature of the present invention is that the laser light irradiation direction 14b and the channel length directions 13b, 16b, and 18b of all the semiconductor layers provided in the layer to be peeled are set to be the same direction, and these directions and a bending direction 19 are set to be orthogonal to each other.

Figure 2:
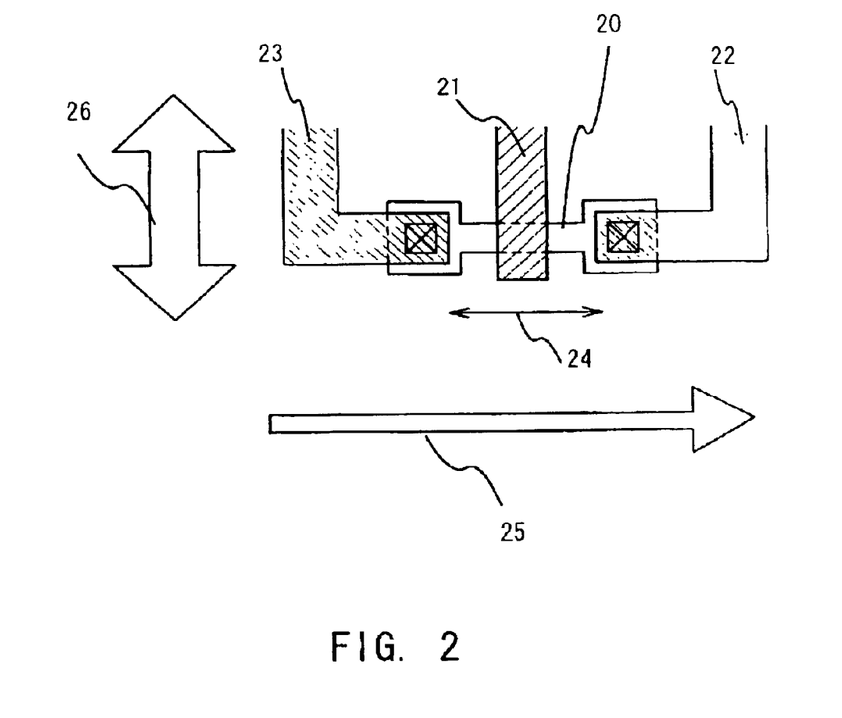
FIG. 2 shows respective directions in the present invention (embodiment mode)

Note that, in order to further clear a correlation among these directions, the case where a TFT is noted is shown in FIG. 2. FIG. 2 briefly shows a TFT having a semiconductor layer 20, a gate electrode 21, and electrodes (source electrode and drain electrode) 22 and 23. Note that the TFT can be produced as follows by using a known technique. First, a semiconductor film having an amorphous structure (made of amorphous silicon or the like) is crystallized by a known crystallization technique to produce a semiconductor film having a crystalline structure (made of polysilicon or the like), and then patterned into a predetermined shape to form the semiconductor layer 20. Next, the semiconductor layer 20 is covered with a gate insulating film (not shown) and then the gate electrode 21 is formed so as to partially overlap the semiconductor layer 20 through the insulating film interposed therebetween. After that, an impurity element for imparting an n-type or p-type conductivity is added to a portion of the semiconductor layer to produce a source region and a drain region, an interlayer insulating film (not shown) covering the gate electrode is formed, and the electrodes (source electrode and drain electrode) 22 and 23 electrically connected with the source region and the drain region are formed on the interlayer insulating film.

In the present invention, laser light whose scanning direction is a scanning direction 25 shown in FIG. 2 is used for manufacturing the TFT. In addition, a portion of the semiconductor layer 20 which is overlapped with the gate electrode 21 through the gate insulating film interposed therebetween serves as a channel. Thus, a channel length direction becomes a channel length direction 24 shown in FIG. 2. The scanning direction 25 of laser light becomes the same direction as the channel length direction 24. In addition, a channel width direction which is a direction orthogonal to the channel length direction 24 is the same direction as a bending direction. The bending direction becomes a bending direction 26 shown in FIG. 2. Note that the example of a top gate TFT is shown in FIG. 2. The present invention can be applied to, for example, a bottom gate (inverse staggered) TFT or a staggered TFT independent on the TFT structure.

Also, the present invention can be applied to various semiconductor device manufacturing methods. Particularly, when a plastic substrate is used for the transfer body and the support member, weight reduction can be realized.

When a liquid crystal display device is manufactured, it is preferable that the support member is used as a counter substrate and bonded to the layer to be peeled using a sealing member as a bonding layer. In this case, the element provided to the layer to be peeled has a pixel electrode. A liquid crystal material is filled into a space between the pixel electrode and the counter substrate. In addition, an order for manufacturing the liquid crystal display device is not particularly limited. For example, the counter substrate as the support member is bonded to the layer to be peeled which is provided to the substrate, a liquid crystal material is injected therebetween, and then the substrate is peeled and the plastic substrate as the transfer body is bonded to the layer to be peeled. Alternatively, after the pixel electrode is formed, the substrate is peeled, the plastic substrate as a first transfer body is boned to the layer to be peeled, and then the counter substrate as a second transfer body is bonded thereto.

Also, when a light emitting device represented by a device having an OLED is manufactured, it is preferable that the support member is used as a sealing member. Thus, a light emitting element is completely shielded from external so as to prevent entrance of a substance such as moisture or oxygen for promoting deterioration of an organic compound layer from external. In addition, when the light emitting device represented by the device having the OLED is manufactured, as in the case of the support member, it is preferable that the transfer body sufficiently prevents entrance of a substance such as moisture or oxygen for promoting deterioration of an organic compound layer from external. In addition, an order for manufacturing the light emitting device is not particularly limited. For example, after the light emitting element is formed, a plastic substrate as the support member is bonded to the layer to be peeled which is provided to a substrate, the substrate is peeled, and a plastic substrate as the transfer body is bonded to the layer to be peeled. Alternatively, after the light emitting element is formed, the substrate is peeled, a plastic substrate as a first transfer body is boned to the layer to be peeled, and then a plastic substrate as a second transfer body is bonded thereto. In addition, when it is important to suppress the deterioration occurring due to transmission of moisture or oxygen, a thin film is formed in contact with the layer to be peeled after peeling to repair a crack caused at peeling. When a film having thermal conductivity, specifically, an aluminum nitride or an aluminum oxynitride is used as the thin film which is in contact with the layer to be peeled, in addition to an effect for radiating heat generated in the element to suppress the deterioration thereof, an effect for preventing deformation or degradation of, the transfer body, specifically, a plastic substrate can be obtained. In addition, the film having thermal conductivity has an effect for preventing mixing of an impurity such as moisture or oxygen from external.

The present invention made by the above constitutions will be described in more detail through the following embodiments.

[Embodiment 1]

Here, an example of laser processing apparatus suitable to the present invention will be described.

Crystallization of amorphous silicon by laser annealing is conducted through a melting-solidification process. More specifically, the case where it is divided into two stages, that is, a stage of generation of crystal nucleus and a stage of crystal growth from the nucleus is considered. However, in the case of laser annealing using a pulse laser beam, a generation position of crystal nucleus and a generation density thereof cannot be controlled but left to natural generation. Thus, a crystal grain is formed at an arbitrary position within the surface of a glass substrate and only a small size of about 0.2 µm to 0.5 µm is obtained. A large number of defects are caused in a crystal boundary. This is considered to be a factor limiting the field effect mobility of a TFT.

It is considered that a method of conducting crystallization with melting solidification by continuous oscillation laser scanning is a method similar to a zone melting method. However, according to the method, a large beam size cannot be obtained. In addition, it is obvious that much time is required for achieving crystallization over the entire surface of a large area substrate.

In this embodiment, a laser processing apparatus for conducting laser beam irradiation with a state in which an irradiation position is substantially aligned with is a position in which a TFT is produced, over the entire surface of a large area substrate for crystallization, so that a crystalline semiconductor film having a large grain size can be formed at high throughput will be described below.

As a laser irradiation apparatus of Embodiment 1, the following apparatus may be used. The laser irradiation apparatus includes a first movable mirror for deflecting a laser beam in a main scanning direction and a second movable mirror for receiving the laser beam deflected in the main scanning direction and conducting scanning in a sub scanning direction, which is a long shape. The second movable mirror has means for scanning a laser beam in the sub scanning direction at a rotation angle about the axis of the long shape direction as a center to irradiate the laser beam to an object to be processed which is placed on a stage.

Also, as another laser irradiation apparatus, the following apparatus may be used. That is, the laser irradiation apparatus includes a first laser beam scanning system and a second laser beam scanning system. The first laser beam scanning system has a first movable mirror for deflecting a laser beam in a first main scanning direction and a long second movable mirror for receiving the laser beam deflected in the first main scanning direction and conducting scanning in a first sub scanning direction. The second laser beam scanning system has a third movable mirror for deflecting a laser beam in a second main scanning direction and a long fourth movable mirror for receiving the laser beam deflected in the second main scanning direction and conducting scanning in a second sub scanning direction. The second movable mirror has means for scanning a laser beam in the first sub scanning direction at a rotation angle about the axis of the long shape direction as a center to irradiate the laser beam to an object to be processed which is placed on a stage. The fourth movable mirror has means for scanning a laser beam in the second sub scanning direction at a rotation angle about the axis of the long shape direction as a center to irradiate the laser beam to the object to be processed which is placed on the stage.

In the above configuration, a galvanomirror or a polygon mirror is applied to the first and second movable mirrors. A solid laser or a gas laser is preferably applied to a laser for providing the laser beam.

In the above configuration, a laser beam is scanned in the main scanning direction by the first movable mirror and scanned in the sub scanning direction by the second movable mirror. Thus, the laser beam can be irradiated in an arbitrary position onto the object to be processed. In addition, a plurality of such laser beam scanning means are provided and laser beams are irradiated to a surface to be formed in biaxial directions. Thus, a laser processing time can be shortened.

Hereinafter, a laser irradiation apparatus of this embodiment will be described with reference to the drawings.

Figure 3:
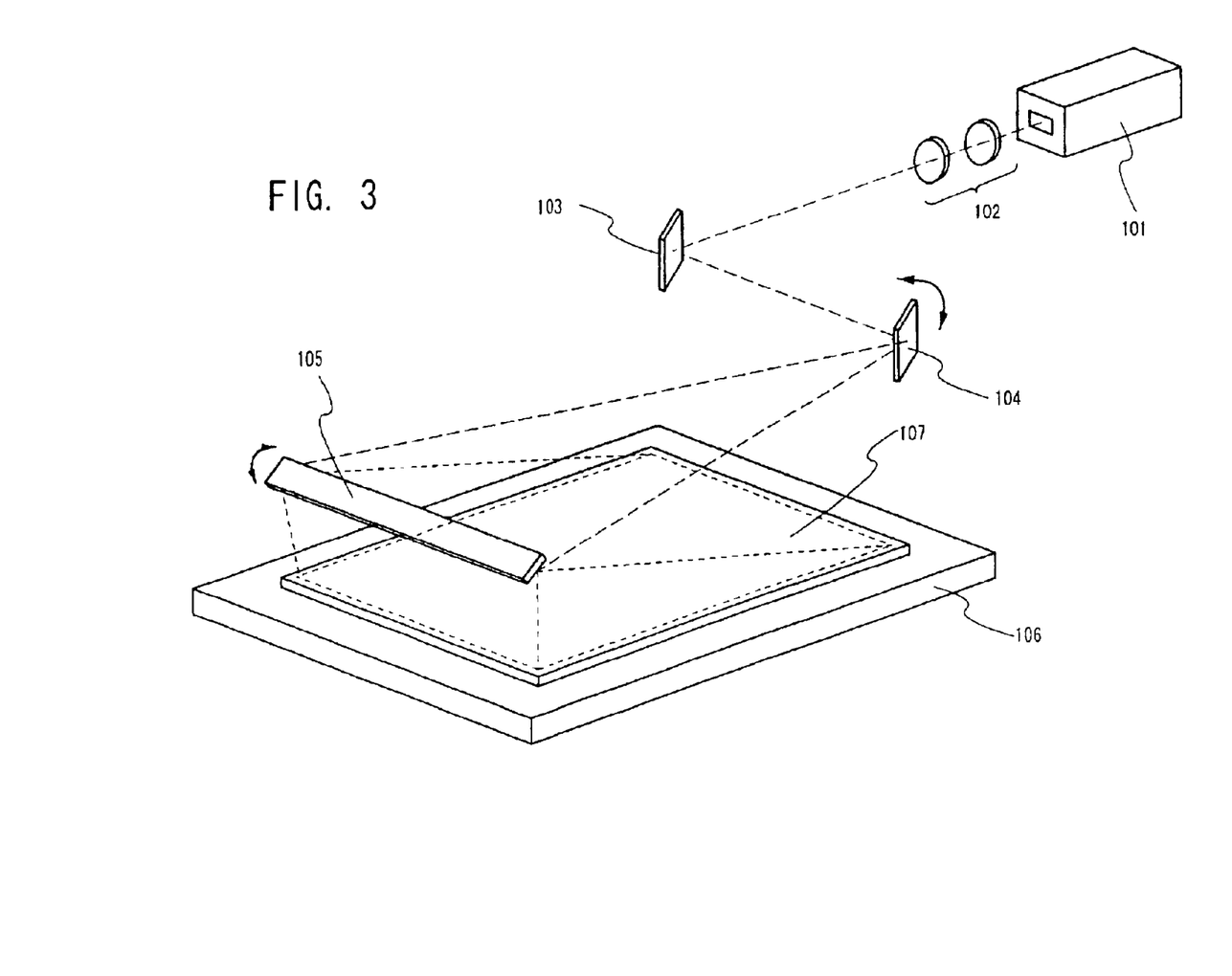
FIG. 3 shows an arrangement of an example of a laser irradiation apparatus (Embodiment 1)

FIG. 3 shows a desirable example of a laser processing apparatus of this embodiment. The shown laser processing apparatus includes a solid laser 101 capable of conducting continuous oscillation or pulse oscillation, a lens such 102 as a collimator lens or a cylindrical lens for condensing a laser beam, a fixed mirror 103 for changing an optical path of the laser beam, a galvanomirror 104 for radially scanning the laser beam in a two-dimensional direction, and a movable mirror 105 for receiving the laser beam by the galvanomirror 104 and irradiating the laser beam toward a surface to be irradiated of a stage 106. An optical axis of the galvanomirror 104 and that of the movable mirror 105 are intersected each other and rotated in e directions shown in FIG. 3. Thus, a laser beam can be scanned over the entire surface of a substrate 107 placed on the stage 106. When the movable mirror 105 is used as an fe mirror to correct an optical path difference, a beam shape on a surface to be irradiated can be also adjusted.

Figure 4:
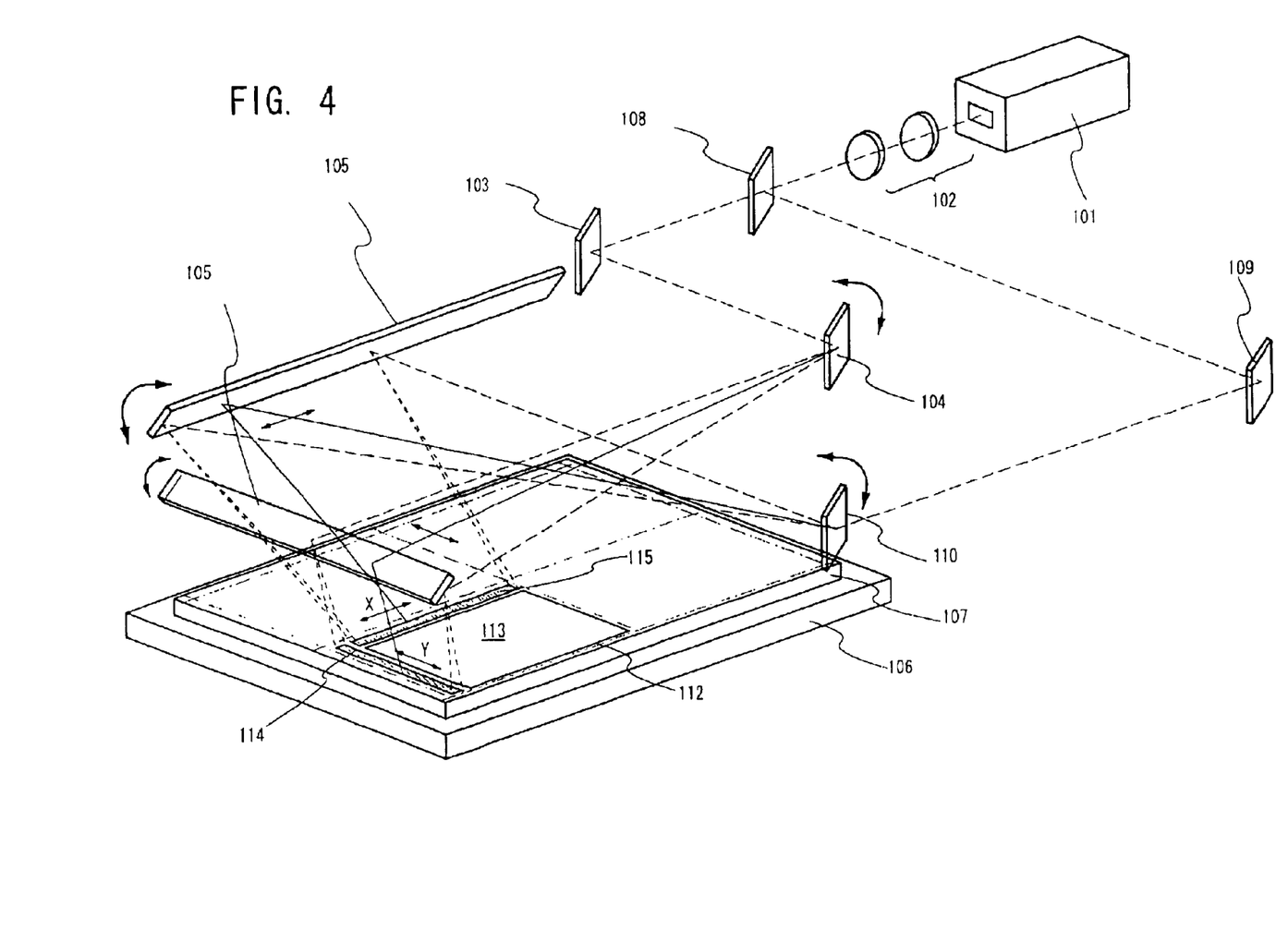
FIG. 4 shows an arrangement of another example of a laser irradiation apparatus (Embodiment 1)

FIG. 3 shows a system for scanning a laser beam in a uniaxial direction of the substrate 107 placed on the stage 106 by the galvanomirror 104 and the movable mirror 105. As a more preferable configuration, as shown in FIG. 4, a half mirror 108, a fixed mirror 109, a galvanomirror 110, and a movable mirror 111 is added to the configuration shown in FIG. 3, and laser beams may be simultaneously scanned in biaxial directions (X- and Y-directions). A processing time can be shortened by using such a configuration. Note that the galvanomirrors 104 and 110 may be replaced by polygon mirrors.

A solid laser is preferable as the laser, and a solid laser using crystal such as YAG, YVO$_4$, YLF, or YAl$_5$O$_{12}$ which is doped with Nd, Tm, or Ho, or a semiconductor laser is preferably used. A fundamental wave of an oscillation wavelength is changed dependent on a doping material. An oscillation is produced at a wavelength of 1 µm to 2 µm. When a non-single crystalline semiconductor film is crystallized, in order to selectively absorb a laser beam by the semiconductor film, it is preferable that the second harmonic to the fourth harmonic of the oscillation wavelength is applied. Typically, in the case of crystallization of amorphous silicon, the second harmonic (532 nm) of an Nd:YAG laser (fundamental wave: 1064 nm) is used.

In addition, a gas laser such an argon laser, a krypton laser, or an excimer laser can be applied.

Also, an atmosphere at laser light irradiation may be an atmosphere containing oxygen, an atmosphere containing nitrogen, an inert atmosphere, or a vacuum and is preferably selected as appropriate according to a purpose.

An oscillation mode may be either pulse oscillation or continuous oscillation. In order to achieve continuous crystal growth with a molten state of the semiconductor film, it is desirable that a continuous oscillation mode is selected.

In the case where a TFT which is made from a semiconductor film crystallized by laser annealing is formed on a substrate, when a crystal growth direction is aligned with a carrier moving direction, high field effect mobility can be obtained. In other words, when the crystal growth direction is aligned with the channel length direction, the field effect mobility can be substantially increased.

When a continuous oscillating laser beam is irradiated to a non-single crystalline semiconductor film for crystallization, a solid-liquid interface is kept. Thus, a continuous crystal growth can be obtained in the scanning direction of the laser beam. As shown in FIG. 4, with respect to a TFT substrate (substrate to which TFTs are mainly formed) 112 used for manufacturing an active matrix liquid crystal display device which driver circuits are integrally formed, driver circuits 114 and 115 are provided in the vicinity of a pixel portion 113. FIG. 4 shows a configuration of a laser irradiation apparatus made in consideration of such a layout. As described above, in the case of the configuration in which laser beams are incident from the biaxial directions, laser beams can be synchronously or asynchronously irradiated in an X-direction and a Y-direction indicated by arrows in the drawing by a combination of the galvanomirrors 104 and 110 and the movable mirrors 105 and 111. In addition, it is possible that a location is designated according to the layout of TFTs and a laser beam is irradiated thereto.

Figure 5:
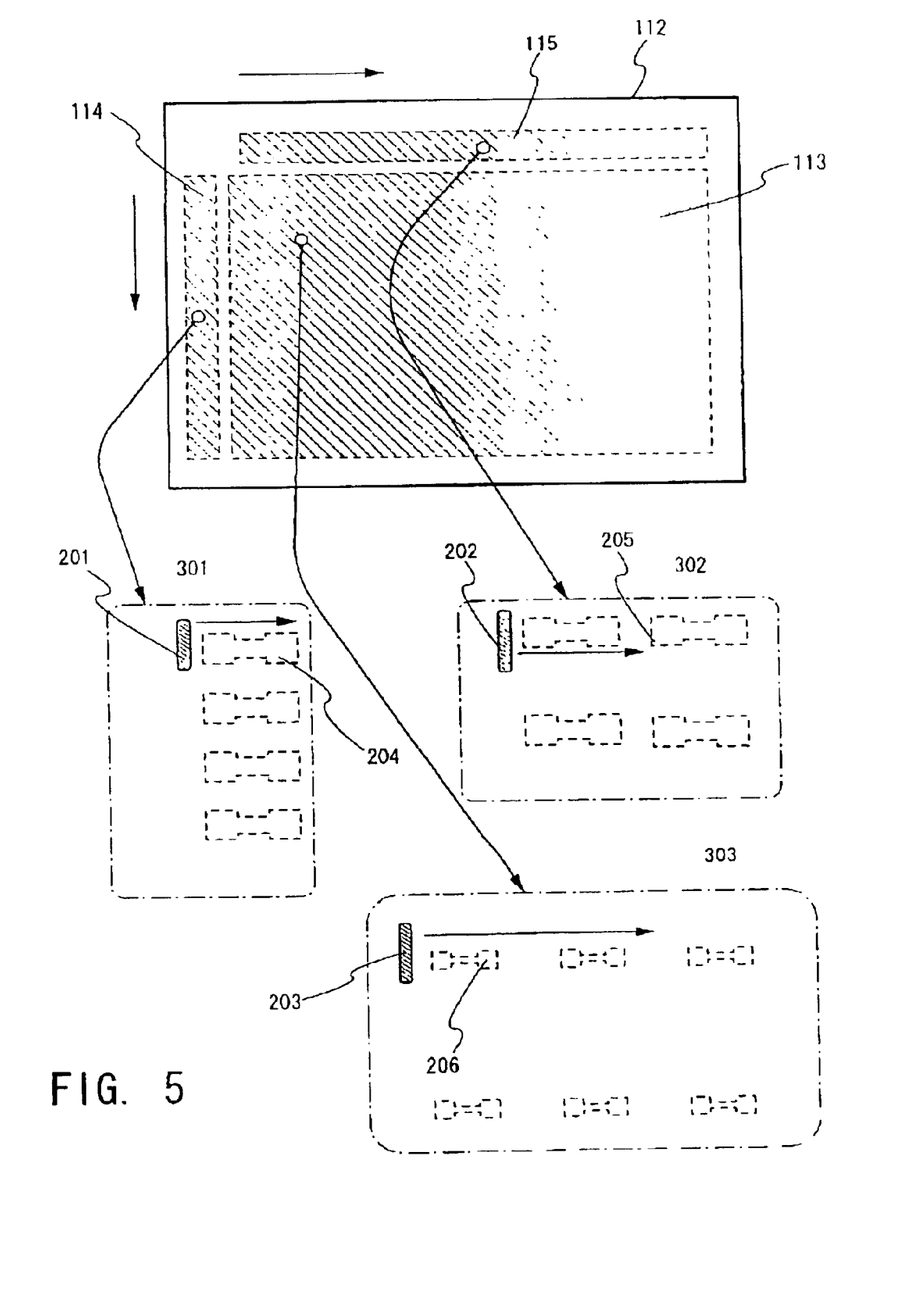
FIG. 5 is an explanatory view of a relationship among a structure of a substrate to which TFTs are provided, an arrangement of semiconductor regions composing the TFTs, and a scanning direction of a laser beam.

FIG. 5 shows a relationship between the substrate 112 to which TFTs are provided and an irradiation direction of a laser beam in detail. Regions in which the pixel portion 113 and the driver circuits 114 and 115 are formed are indicated by dot lines on the substrate 112. In a stage of crystallization, a non-single crystalline semiconductor film is formed on the entire surface. Semiconductor regions for forming TFTs can be designated by alignment makers or the like formed in end portions of the substrate.

For example, the driver circuit portion 114 is a region for forming a scan line driver circuit. In its partially enlarged view 301, semiconductor regions 204 of TTFs and a scanning direction of a laser beam 201 are indicated. The semiconductor regions 204 having an arbitrary shape can be applied. In any case, the channel length direction is aligned with the scanning direction of the laser beam 201. In addition, the driver circuit portion 115 extended in a direction in which it intersects the driver circuit portion 114 is a region for forming a data line driver circuit, and an arrangement of semiconductor regions 205 is aligned with a scanning direction of a laser beam 202 (enlarged view 302). Similarly, in the case of the pixel portion 113, as shown in an enlarged view 303, an arrangement of semiconductor regions 206 is aligned and a laser beam 202 is scanned in a channel length direction. The scanning direction of the laser beam is not limited to a single direction and round trip scanning may be conducted.

Figures 6A, 6B:
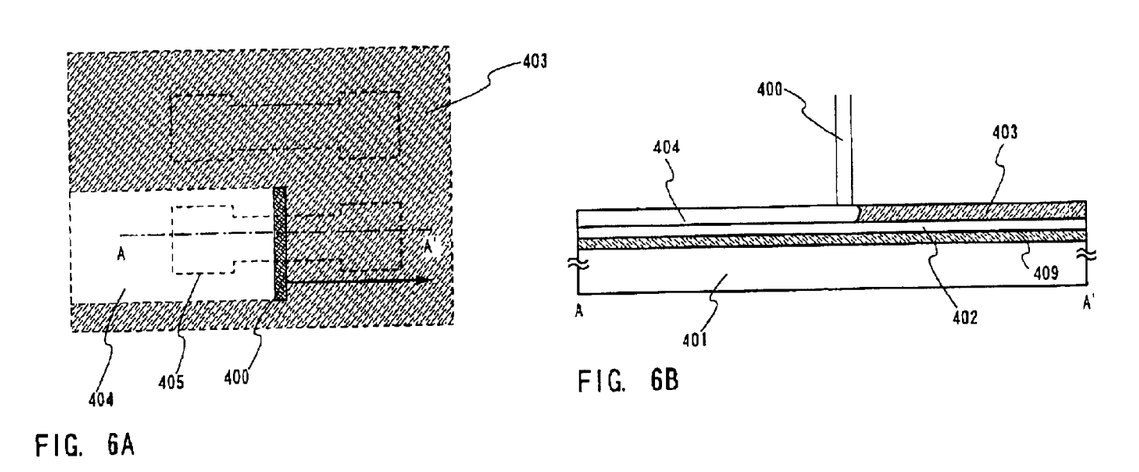
FIGS. 6A to 6D are explanatory views of a scanning direction of a laser beam to a semiconductor film and manufacturing steps for a top gate TFT.

Next, steps of crystallizing a non-single crystalline semiconductor film and producing a TFT from the formed crystalline semiconductor film will be descried with reference to FIGS. 6A to 6D. FIG. 6B is a longitudinal cross sectional view. A non-single crystalline semiconductor film 403 is formed on a glass substrate 401. A typical example of the non-single crystalline semiconductor film 403 is an amorphous silicon film. In addition, an amorphous silicon germanium film or the like can be applied. The thickness of 10 nm to 20 nm can be applied and may be further increased in accordance with a wavelength of a laser beam and an energy density thereof. In addition, it is desirable to employ such a measure that a blocking layer 402 is provided between the glass substrate 401 and the non-single crystalline semiconductor film 403 so as not to diffuse an impurity such as alkali metal from the glass substrate into the semiconductor film. A silicon nitride film, a silicon oxynitride film, or the like is applied as the blocking layer 402.

Also, a laminate 409 of a metallic layer or a metallic nitride layer and an oxide layer is formed between the blocking layer 402 and the substrate 401 for peeling. As the metallic layer or the nitride layer, there is preferably used a nitride comprising a single layer made of an element selected from Ti, Al, Ta, W, Mo, Cu, Cr, Nd, Fe, Ni, Co, Ru, Rh, Pd, Os, Ir, and Pt, or an alloy material or a compound material which contains the above element as a main ingredient, or a laminate of those. For example, a single layer made of titanium nitride, tungsten nitride, tantalum nitride, or molybdenum nitride, or a laminate of those is preferably used. Here, a titanium nitride film having a film thickness of 100 nm which is formed by a sputtering method is used. Note that, when a contact property to the substrate is low, a buffer layer is preferably provided. A single tungsten layer and a tungsten nitride have a high contact property and are exemplified as preferable materials. In addition, as the oxide layer, a single layer made of a silicon oxide material or a metallic oxide material, or a laminate of those is preferably used. Here, a silicon oxide film having a film thickness of 200 nm which is formed by a sputtering method is used. Bonding force between the metallic nitride layer and the oxide layer has a sufficient strength to withstand heat treatment. Thus, film peeling (which is also called peeling) or the like is not caused. However, peeling can be simply performed in an inner portion of the oxide layer or a boundary thereof by a physical means. Note that a glass substrate is used here. However, various substrates can be used in the above peeling method. As the substrate 401, a quartz substrate, a ceramic substrate, a silicon substrate, a metallic substrate, or a stainless steel substrate may be used.

Next, crystallization is conducted by irradiation of a laser beam 400. Thus, a crystalline semiconductor film 404 can be formed. As shown in FIG. 6A, the laser beam 400 is scanned to a position of a semiconductor region 405 where a TFT will be formed. A beam shape can be set to be an arbitrary shape such as a rectangular shape, a linear shape, or an elliptical shape. With respect to the laser beam condensed by an optical system, an energy intensity at a central region thereof is not necessarily equal to that at an edge region. Thus, it is desirable that the semiconductor region 405 is not overlapped with the edge region of the beam.

Scanning of the laser beam is not limited to scanning in only a single direction and round trip scanning may be conducted. In this case, a laser energy density is changed every time scanning is conducted. Thus, a stepwise crystal growth can be produced. The scanning can also serve as dehydrogenation processing which is often required in the case of crystallization of amorphous silicon. For example, first scanning is conducted at a low energy density to release hydrogen, and then second scanning is conducted at an increased energy density to complete the crystallization.

When continuous oscillation laser beam irradiation is conducted in such a laser beam irradiation method, the growth of crystal having a larger grain size is possible. Of course, in order to realize this, it is necessary to set parameters such as a scanning speed of a laser beam and an energy density thereof in detail as appropriate. When the scanning speed is set to 10 cm/sec to 80 cm/sec, the above crystal growth can be realized. It is said that a speed of crystal growth through melting-solidification using a pulse laser is 1 m/sec. If a laser beam is scanned at a speed lower than the crystal growth speed and slow cooling is conducted, continuous crystal growth in a solid-liquid interface is possible. Thus, an increase in a grain size of crystal can be realized.

According to the laser irradiation apparatus of this embodiment, under such a situation, it is possible that a position on the substrate is arbitrarily designated and laser beam irradiation is conducted for crystallization. When laser beam irradiation is conducted from biaxial directions, a throughput can be further improved.

Also, when laser beam irradiation is conducted, clean peeling from the substrate can be performed with smaller force. Thus, a layer to be peeled which has a large area can be peeled over the entire surface thereof.

In order to further promote peeling, a granular oxide (for example, ITO (alloy of indium oxide and tin oxide), an alloy of indium oxide and zinc oxide ($In_2O_3$—ZnO), a zinc oxide (ZnO) or the like) may be provided in an interface between the nitride layer, the metallic layer, or the metallic nitride layer and the oxide layer.

Figure 6C:
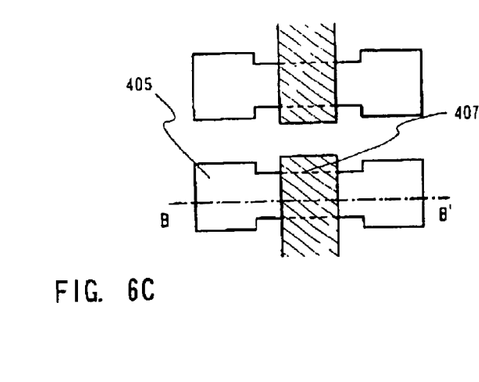
Figure 6D:
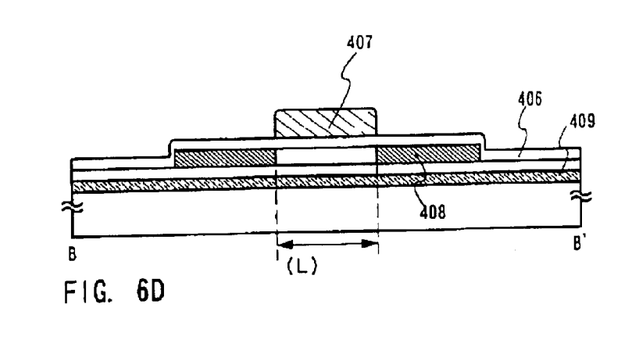

Then, as shown in FIGS. 6C and 6D, the formed crystalline semiconductor film is etched to form a semiconductor region 405 in an island-shape. In the case of a top gate TFT, a gate insulating film 406, a gate electrode 407, and impurity regions 408 having a conductivity type are formed on the semiconductor region 405 to produce a TFT. Then, wirings, an interlayer insulating film, and the like are preferably formed as appropriate by a known technique to produce an element.

Thus, after obtaining the element having the TFT, the substrate 401 is peeled in accordance with the embodiment mode. In this embodiment, a resultant layer formed on the blocking layer 402 corresponds to the layer to be peeled 11b which is described in the embodiment mode. When the mechanical strength of the layer to be peeled is insufficient, it is preferable that the substrate is peeled after a support member (not shown) for fixing the layer to be peeled is bonded thereto.

The layer to be peeled which is formed on the oxide layer can be simply separated from the substrate by peeling. The peeled layer can be bent in a certain direction. It is needless to say that the layer to be peeled can be bonded to a transfer body (not shown) having a curved surface.

Also in this embodiment, according to the present invention, the irradiation direction (scanning direction) of the laser light and the channel length directions of all semiconductor layers 204 to 206 and 405 provided to the layer to be peeled are set to be the same direction, and these directions and the bending direction are set to be orthogonal to each other. Thus, a display having a curved surface can be realized.

Also, this embodiment can be freely combined with the embodiment mode.

[Embodiment 2]

The example of the top gate TFT is descried in Embodiment 1. Here, an example of a bottom gate TFT will be described. Also, the structure except for the TFT is the same one as Embodiment 1 and the description is thereof omitted here.

Next, steps of crystallizing a non-single crystalline semiconductor film and producing a TFT from the formed crystalline semiconductor film will be descried with reference to FIGS. 7A to 7D.

Figure 7A:
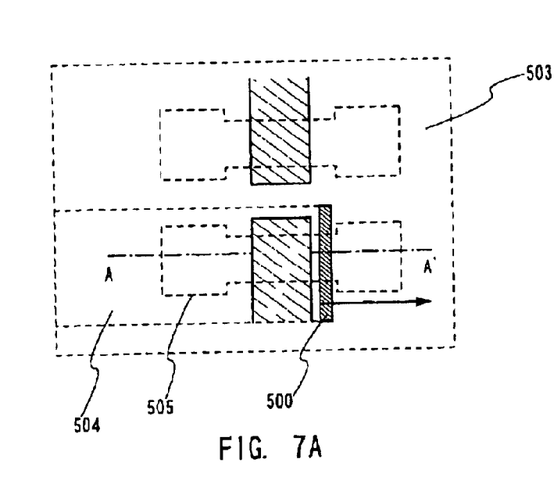
FIGS. 7A to 7D are explanatory views of a scanning direction of a laser beam to a semiconductor film and manufacturing steps for a bottom gate TFT.
Figure 7B:
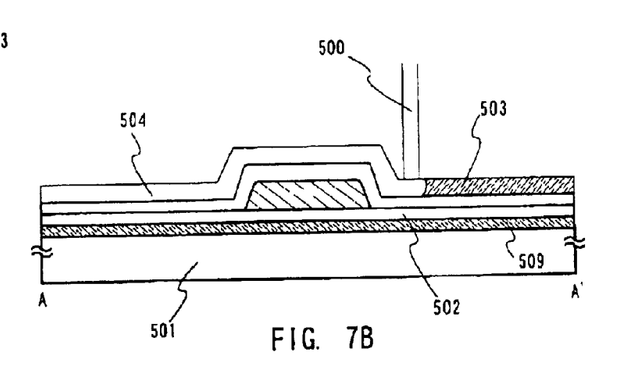

FIG. 7B is a longitudinal cross sectional view. A non-single crystalline semiconductor film 503 is formed on a gate insulating film 506 covering a gate electrode. A typical example of the non-single crystalline semiconductor film 503 is an amorphous silicon film. In addition, an amorphous silicon germanium film or the like can be applied. The thickness of 10 nm to 200 nm can be applied and may be further increased in accordance with a wavelength of a laser beam and an energy density thereof. In addition, it is desirable to employ such a measure that a blocking layer 502 is provided between the glass substrate 501 and the gate electrode so as not to diffuse an impurity such as alkali metal from the glass substrate into the semiconductor film. A silicon nitride film, a silicon oxynitride film, or the like is applied as the blocking layer 502.

Also, a laminate 509 of a metallic layer or a metallic nitride layer and an oxide layer is formed between the blocking layer 502 and the substrate 501 for peeling. As the metallic layer or the nitride layer, there is preferably used a nitride comprising a single layer made of an element selected from Ti, Al, Ta, W, Mo, Cu, Cr, Nd, Fe, Ni, Co, Ru, Rh, Pd, Os, Ir, and Pt, or an alloy material or a compound material which contains the above element as a main ingredient, or a laminate of those is preferably used. For example, a single layer made of titanium nitride, tungsten nitride, tantalum nitride, or molybdenum nitride, or a laminate of those is preferably used. Here, a titanium nitride film having a film thickness of 100 nm which is formed by a sputtering method is used. Note that, when a contact property to the substrate is low, a buffer layer is preferably provided. A single tungsten layer and a tungsten nitride have a high contact property and are exemplified as preferable materials. In addition, as the oxide layer, a single layer made of a silicon oxide material or a metallic oxide material, or a laminate of those is preferably used. Here, a silicon oxide film having a film thickness of 200 nm which is formed by a sputtering method is used. Bonding force between the metallic nitride layer and the oxide layer has a strength resistant to heat treatment. Thus, film peeling (which is also called peeling) or the like is not caused. However, peeling can be simply performed in an inner portion of the oxide layer or a boundary thereof by a physical means.

Next, crystallization is conducted by irradiation of a laser beam 500. Thus, a crystalline semiconductor film 504 can be formed. The laser beam is obtained from is the laser processing apparatus described in Embodiment 1. As shown in FIG. 7A, the laser beam 500 is scanned to a position of a semiconductor region 505 where a TFT will be formed. A beam shape can be set to be an arbitrary shape such as a rectangular shape, a linear shape, or an elliptical shape. With respect to the laser beam condensed by an optical system, an energy intensity at a central region thereof is not necessarily equal to that at an edge region. Thus, it is desirable that the semiconductor region 505 is not overlapped with the edge region of the beam.

Scanning of the laser beam is not limited to scanning in only a single direction and round trip scanning may be conducted. In this case, a laser energy density is changed every time scanning is conducted. Thus, a stepwise crystal growth can be produced. The scanning can also serve as dehydrogenation processing which is often required in the case of crystallization of amorphous silicon. For example, first scanning is conducted at a low energy density to release hydrogen, and then second scanning is conducted at an increased energy density to complete the crystallization.

When continuous oscillation laser beam irradiation is conducted in such a laser beam irradiation method, the growth of crystal having a larger grain size is possible. Of course, in order to realize this, it is necessary to set parameters such as a scanning speed of a laser beam and an energy density thereof in detail as appropriate. When the scanning speed is set to 10 cm/sec to 80 cm/sec, the above crystal growth can be realized. It is said that a speed of crystal growth through melting-solidification using a pulse laser is 1 m/sec. If a laser beam is scanned at a speed lower than the crystal growth speed and slow cooling is conducted, continuous crystal growth in a solid-liquid interface is possible. Thus, an increase in a grain size of crystal can be realized.

Also, when laser beam irradiation is conducted, clean peeling from the substrate can be performed with smaller force. Thus, a layer to be peeled which has a large area can be peeled over the entire surface thereof.

In order to further promote peeling, a granular oxide (for example, ITO (alloy of indium oxide and tin oxide), an alloy of indium oxide and zinc oxide ($In_2O_3$—ZnO), a zinc oxide (ZnO) or the like) may be provided in an interface between the nitride layer, the metallic layer, or the metallic nitride layer and the oxide layer.

Figure 7C:
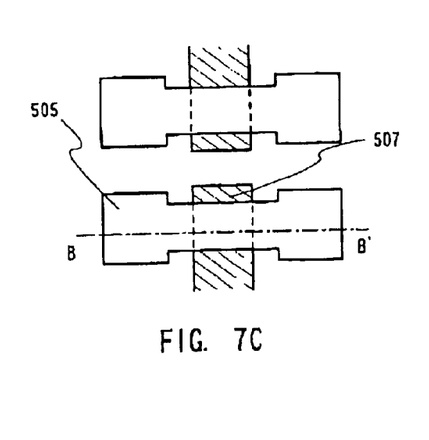
Figure 7D:
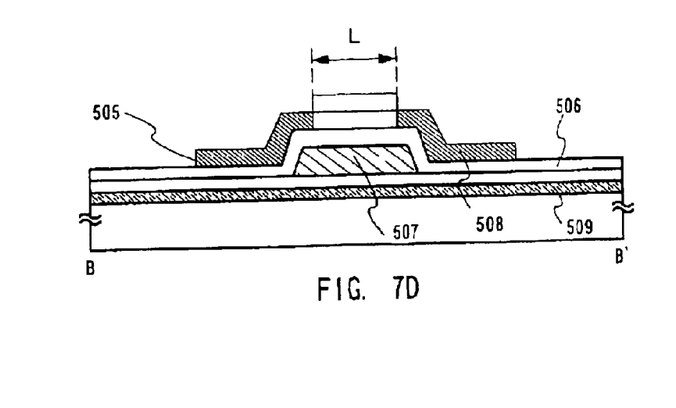

Then, as shown in FIGS. 7C and 7D, the formed crystalline semiconductor film is etched to form a semiconductor region 505 in an island-shape. Here, an etching stopper is provided on a semiconductor region 505, and impurity regions 508 having one conductivity type are formed to produce a TFT. Then, wirings, an interlayer insulating film, and the like are preferably formed as appropriate by a known technique to produce an element.

Thus, after obtaining the element having the TFT, the substrate 501 is peeled in accordance with the embodiment mode. In this embodiment, a resultant layer formed on the blocking layer 502 corresponds to the layer to be peeled 11b which is described in the embodiment mode. When the mechanical strength of the layer to be peeled is insufficient, it is preferable that the substrate is peeled after a support member (not shown) for fixing the layer to be peeled is bonded thereto.

The layer to be peeled which is formed on the oxide layer can be simply separated from the substrate by peeling. The peeled layer can be bent in a certain direction. It is needless to say that the layer to be peeled can be bonded to a transfer body (not shown) having a curved surface.

Even in this embodiment, the irradiation direction (scanning direction) of the laser light and the channel length directions of the semiconductor layer 505 provided to the layer to be peeled are set to be the same direction, and these directions and the bending direction are set to be orthogonal to each other. Thus, a display having a curved surface can be realized.

Also, this embodiment can be freely combined with the embodiment mode.

[Embodiment 3]

The peeling method of conducting peeling by utilizing film stresses of two layers (stress strain) is used in Embodiments 1 and 2. A peeling method is not particularly limited. For example, a method of providing a separate layer between the layer to be peeled and the substrate and removing the separate layer by a chemical solution (etchant) to separate the layer to be peeled and the substrate can be used. Alternatively, there can be used a method of providing a separate layer made of amorphous silicon (or polysilicon) between the layer to be peeled and the substrate and irradiating laser light thereto through the substrate to release hydrogen contained in the amorphous silicon, thereby producing gaps to separate the layer to be peeled and the substrate.

Here, an example in which amorphous silicon (or polysilicon) containing a large amount of hydrogen is used for the separate layer and laser light is irradiated to the separate layer for peeling is shown in FIGS. 8A to 8D.

Figure 8A:
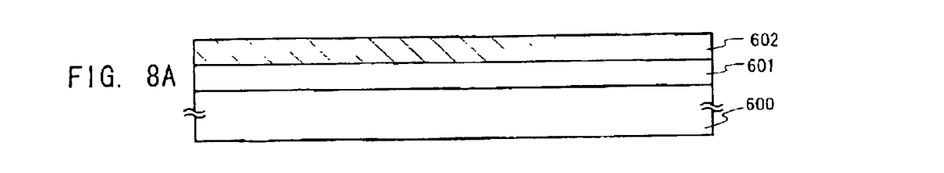
FIGS. 8A to 8D show manufacturing steps according to Embodiment 3.

In FIGS. 8A, reference numeral 600 denotes a substrate, 601 denotes a separate layer, and 602 denotes a layer to be peeled.

In FIG. 8A, a translucent substrate, a glass substrate, a quartz substrate, or the like is used as the substrate 600.

Next, the separate layer 601 is formed. Amorphous silicon or polysilicon is used for the separate layer 601. Note that the separate layer 601 is preferably formed by a film formation method such as a sputtering method or a plasma CVD method while mixing a large amount of hydrogen therein as appropriate.

Next, the layer to be peeled 602 is formed on the separate layer 601 (FIG. 8A). It is preferable that the layer to be peeled 602 includes various elements (such as a thin film diode, a photoelectric conversion element which is made of a silicon PIN junction, and a silicon resistor element) represented by a TFT. In addition, heat treatment can be performed within a heat resistance range of the substrate 600. However, it is required that film peeling or the like is not caused in the separate layer 601 by heat treatment in a manufacturing step for the layer to be peeled 602. When the peeling is conducted using laser light as in this embodiment, it is desirable that a heat treatment temperature is set to 410° C. or lower so as not to release hydrogen before the peeling and the element included in the layer to be peeled is produced.

Figure 8B:
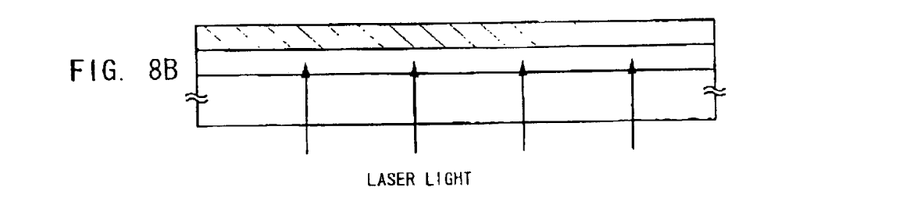

Next, laser light is irradiated to the separate layer through the substrate 600 (FIG. 8B). For the laser light, a gas laser such as an excimer laser, a solid laser such as a YAG laser, or a semiconductor laser is preferably used. In addition, a laser oscillation mode may be either continuous oscillation or pulse oscillation. A laser beam may have a linear shape or a rectangular shape. In this embodiment, the laser light irradiation apparatus described in Embodiment 1 is used. When the laser light irradiation apparatus described in Embodiment 1 is used, laser beam irradiation can be conducted over the entire surface of a large area substrate at a high throughput. In addition, the laser light irradiation apparatus described in Embodiment 1 can be used for not only crystallization and peeling but also various annealings.

Figure 8C:
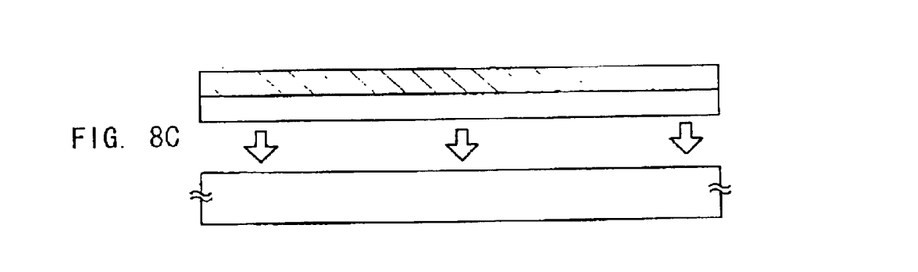

When the above laser light irradiation is conducted to release hydrogen contained in the separate layer 601, gaps are produced to separate the layer to be peeled 603 and the substrate 600 (FIG. 8C). When the laser light irradiation apparatus is described in Embodiment 1 is used, the layer to be peeled which has a large area can be peeled over the entire surface thereof at a high yield.

Figure 8D:
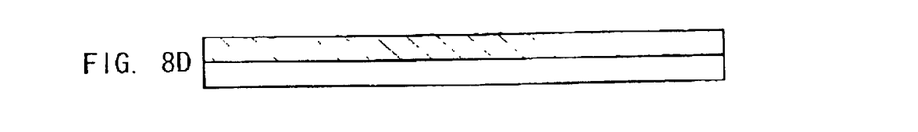

A state obtained after the peeling is shown in FIG. 8D. Here, an example in which the layer to be peeled 602 is supposed to have a sufficient mechanical strength is indicated here. When the mechanical strength of the layer to be peeled 602 is insufficient, it is preferable that a support member (not shown) for fixing the layer to be peeled 602 is bonded thereto and then it is peeled off.

The peeled layer can be bent in a certain direction. It is needless to say that the layer to be peeled can be bonded to a transfer body (not shown) having a curved surface.

Also in this embodiment, the irradiation direction (scanning direction) of the laser light and the channel length directions of all semiconductor layers provided to the layer to be peeled are set to be the same direction, and these directions and the bending direction are set to be orthogonal to each other. Thus, a display having a curved surface can be realized.

Also, this embodiment can be freely combined with the embodiment mode, Embodiment 1, or Embodiment 2.

Note that, when this embodiment is combined with Embodiment 1, it is preferable that the separate layer 601 in this embodiment is used instead of the laminate 409 in Embodiment 1 and laser irradiation is conducted from the rear surface before peeling is conducted.

Similarly, when this embodiment is combined with Embodiment 2, it is preferable that the separate layer 601 in this embodiment is used instead of the laminate 509 in Embodiment 2 and laser irradiation is conducted from the rear surface before peeling is conducted.

According to the present invention, laser beam irradiation is conducted for crystallization over the entire surface of a large area substrate to a position of a semiconductor region where a TFF is formed. Thus, a crystalline semiconductor having a large grain size film can be formed at a high throughput. In addition, characteristics of the TFT can be improved and a display having a curved surface can be realized.

What is claimed is:

1. A semiconductor device comprising:
   a plurality of thin film transistors provided over a base member having a curved surface which is bent in one of a convex shape and a concave shape,
   wherein all channel length directions of the plurality of thin film transistors are aligned with a same direction, and
   the channel length directions are different from a direction in which the base member is bent.

2. A device according to claim 1,
   wherein the channel length directions are the same direction as a scanning direction of laser light irradiated to semiconductor layers for the thin film transistors.

3. A device according to claim 1,
   wherein the direction in which the base member is bent is orthogonal to the channel length directions.

4. A semiconductor device comprising:
   a pixel portion and a driver circuit portion provided over a base member having a curved surface which is bent in one of a convex shape and a concave shape,
   wherein a channel length direction of a thin film transistor provided to the pixel portion and that of a thin film transistor provided to the driver circuit portion are aligned with the same direction, and
   the channel length directions are different from a direction in which the base member is bent.

5. A device according to claim 4,
   wherein the channel length directions are the same direction as a scanning direction of laser light irradiated to semiconductor layers for the thin film transistors.

6. A device according to claim 4,
   wherein the direction in which the base member is bent is orthogonal to the channel length directions.

7. A semiconductor device comprising:
   a plurality of thin film transistors provided over a base member having a curved surface which is capable of being bent in one of a convex shape and a concave shape,
   wherein all channel width directions of the plurality of thin film transistors are aligned with the same direction, and
   the channel width directions are not orthogonal to a direction in which the base member is bent.

8. A semiconductor device comprising a plurality of thin film transistors,
   wherein all channel length directions of the plurality of thin film transistors provided over a surface of a base member including a curved surface having a direction with a curvature and a direction with no curvature are aligned with the same direction, and
   the channel length directions are the same direction as the direction with no curvature.

9. A device according to claim 8,
   wherein the channel length directions are the same direction as a scanning direction of laser light irradiated to semiconductor layers for the thin film transistors.

10. A semiconductor device comprising:
    a plurality of thin film transistors provided over a base member which can be bent in one of a convex shape and a concave shape,
    wherein all channel length directions of the plurality of thin film transistors are aligned with the same direction, and
    a direction in which the base member can be bent is different from the channel length directions.

11. A device according to claim 10,
    wherein the channel length directions are the same direction as a scanning direction of laser light irradiated to semiconductor layers for the thin film transistors.

12. A device according to claim 10,
    wherein the direction in which the base member is bent is orthogonal to the channel length directions.

13. A semiconductor device comprising:
    a scan line driver circuit comprising a plurality of thin film transistors provided over a base member having a curved surface which is bent in one of a convex shape and a concave shape,
    wherein all channel length directions of the plurality of thin film transistors are aligned with the same direction, and
    wherein the channel length directions are different from a direction in which the base member is bent.

14. A device according to claim 13,
    wherein the channel length directions are the same direction as a scanning direction of laser light irradiated to semiconductor layers for the thin film transistors.

15. A device according to claim 13,
    wherein the direction in which the base member is bent is orthogonal to the channel length directions.

16. A semiconductor device comprising:
    a data line driver circuit comprising a plurality of thin film transistors provided over a base member having a curved surface which is bent in one of a convex shape and a concave shape,
    wherein all channel length directions of the plurality of thin film transistors are aligned with a same direction, and
    wherein the channel length directions are different from a direction in which the base member is bent.

17. A device according to claim 16,
    wherein the channel length directions are the same direction as a scanning direction of laser light irradiated to semiconductor layers for the thin film transistors.

18. A deviced according to claim 16,
    wherein the direction in which the base member is bent is orthogonal to the channel length directions.

19. A semiconductor device comprising:
    a pixel portion comprising a plurality of thin film transistors provided over a base member having a curved surface which is bent in one of a convex shape and a concave shape,
    wherein all channel length directions of the plurality of thin film transistors are aligned with a same direction, and
    wherein the channel legth directions are different from a direction in which the base member is bent.

20. A device according to claim 19,
    wherein the channel length directions are the same direction as a scanning direction of laser light irradiated to semiconductor layers for the thin film transistors.

21. A device according to claim 19,
    wherein the direction in which the base member is bent is orthogonal to the channel length directions.

* * * * *